US011616152B2

(12) United States Patent
Borthakur et al.

(10) Patent No.: US 11,616,152 B2
(45) Date of Patent: Mar. 28, 2023

(54) SEMICONDUCTOR DEVICES WITH SINGLE-PHOTON AVALANCHE DIODES AND HYBRID ISOLATION STRUCTURES

(71) Applicant: SEMICONDUCTOR COMPONENTS INDUSTRIES, LLC, Phoenix, AZ (US)

(72) Inventors: Swarnal Borthakur, Boise, ID (US); Marc Allen Sulfridge, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 159 days.

(21) Appl. No.: 16/948,325

(22) Filed: Sep. 14, 2020

(65) Prior Publication Data

US 2021/0175380 A1 Jun. 10, 2021

Related U.S. Application Data

(60) Provisional application No. 62/981,902, filed on Feb. 26, 2020, provisional application No. 62/943,475, filed on Dec. 4, 2019.

(51) Int. Cl.
*H01L 27/146* (2006.01)
*H01L 31/107* (2006.01)
(Continued)

(52) U.S. Cl.
CPC ........ *H01L 31/02027* (2013.01); *G02B 3/06* (2013.01); *H01L 27/1463* (2013.01);
(Continued)

(58) Field of Classification Search
CPC ........ H01L 31/02027; H01L 27/14605; H01L 27/14621; H01L 27/14627;
(Continued)

(56) References Cited

U.S. PATENT DOCUMENTS 7,054,534 B1 5/2006 Gunn, III et al.
7,800,192 B2 9/2010 Venezia et al.
(Continued)

FOREIGN PATENT DOCUMENTS

CN 109659377 A * 4/2019 ......... H01L 27/1443

OTHER PUBLICATIONS

Yokogawa et al.: "IR sensitivity enhancement of CMOS Image Sensor with diffractive light trapping pixels." Scientific Reports 7, 3832 (2017).
(Continued)

*Primary Examiner* — Jennifer D Bennett
*Assistant Examiner* — Erin R Garber
(74) *Attorney, Agent, or Firm* — Treyz Law Group, P.C.; Joseph F. Guihan

(57) ABSTRACT

An imaging device may include single-photon avalanche diodes (SPADs). To improve the sensitivity and signal-to-noise ratio of the SPADs, light scattering structures may be formed in the semiconductor substrate to increase the path length of incident light through the semiconductor substrate. To mitigate crosstalk, an isolation structure may be formed in a ring around the SPAD. The isolation structure may be a hybrid isolation structure with both a metal filler that absorbs light and a low-index filler that reflects light. The isolation structure may be formed as a single trench or may include a backside deep trench isolation portion and a front side deep trench isolation portion. The isolation structure may also include a color filtering material.

20 Claims, 10 Drawing Sheets

(51) Int. Cl.
*H01L 31/0232* (2014.01)
*H01L 31/02* (2006.01)
*H01L 31/055* (2014.01)
*G02B 3/06* (2006.01)
*H04N 5/361* (2011.01)

(52) U.S. Cl.
CPC .. *H01L 27/14605* (2013.01); *H01L 27/14621* (2013.01); *H01L 27/14627* (2013.01); *H01L 27/14629* (2013.01); *H01L 27/14643* (2013.01); *H01L 27/14649* (2013.01); *H01L 31/02327* (2013.01); *H01L 31/055* (2013.01); *H01L 31/107* (2013.01); *H01L 27/1464* (2013.01); *H04N 5/361* (2013.01)

(58) Field of Classification Search
CPC ........... H01L 27/14629; H01L 27/1463; H01L 27/14643; H01L 27/14649; H01L 31/02327; H01L 31/107; H01L 31/055; H01L 27/1464; H01L 31/02363; H04N 5/361; H04N 5/374; G02B 3/06; Y02E 10/52
See application file for complete search history.

(56) References Cited

U.S. PATENT DOCUMENTS

| | | | | |
|---|---|---|---|---|
| 8,889,455 | B2* | 11/2014 | Duane | H01L 27/14665 438/57 |
| 9,373,732 | B2* | 6/2016 | Velichko | H01L 31/02327 |
| 10,304,987 | B2 | 5/2019 | Droz et al. | |
| 11,032,496 | B2 | 6/2021 | Webster | |
| 11,289,524 | B2 | 3/2022 | Sulfridge et al. | |
| 2007/0075423 | A1 | 4/2007 | Ke et al. | |
| 2008/0303932 | A1* | 12/2008 | Wang | H01L 27/1463 348/308 |
| 2013/0015331 | A1 | 1/2013 | Birk et al. | |
| 2013/0082286 | A1 | 4/2013 | Finkelstein et al. | |
| 2013/0193546 | A1 | 8/2013 | Webster et al. | |
| 2014/0015085 | A1* | 1/2014 | Ikeda | H01L 27/1464 348/222.1 |
| 2014/0049783 | A1 | 2/2014 | Royo Royo et al. | |
| 2014/0077323 | A1* | 3/2014 | Velichko | H01L 27/14629 257/432 |
| 2015/0340391 | A1 | 11/2015 | Webster | |
| 2017/0339355 | A1* | 11/2017 | Lenchenkov | H04N 5/36961 |
| 2017/0366769 | A1 | 12/2017 | Mlinar et al. | |
| 2018/0026147 | A1 | 1/2018 | Zhang et al. | |
| 2018/0182806 | A1* | 6/2018 | Jin | H01L 27/14627 |
| 2018/0211990 | A1 | 7/2018 | Yorikado et al. | |
| 2018/0308881 | A1* | 10/2018 | Hynecek | G01S 7/4813 |
| 2019/0097075 | A1 | 3/2019 | Rae | |
| 2019/0131339 | A1 | 5/2019 | Chiang et al. | |
| 2019/0131478 | A1 | 5/2019 | Wang et al. | |
| 2019/0165026 | A1 | 5/2019 | Kuo et al. | |
| 2019/0326482 | A1 | 10/2019 | Brick et al. | |
| 2020/0020730 | A1 | 1/2020 | Mlinar et al. | |
| 2020/0058808 | A1 | 2/2020 | Morimoto et al. | |
| 2020/0284883 | A1 | 9/2020 | Ferreira et al. | |
| 2021/0082978 | A1 | 3/2021 | Hsieh | |
| 2021/0408090 | A1* | 12/2021 | Kohyama | H04N 5/369 |
| 2022/0199668 | A1 | 6/2022 | Ootani et al. | |

OTHER PUBLICATIONS

Park et al.: "Pixel Technology for Improving IR Quantum Efficiency of Backside-illuminated CMOS Image Sensor." International Image Sensor Society, 2019 Workshop. Jun. 23-27, 2019.

Green et al.: "Characterization of 23-Percent Efficient Silicon Solar Cells." IEEE Transactions on Electron Devices. vol. 37, No. 2. Feb. 1990.

* cited by examiner

SEMICONDUCTOR DEVICES WITH SINGLE-PHOTON AVALANCHE DIODES AND HYBRID ISOLATION STRUCTURES

This application claims the benefit of provisional patent application No. 62/943,475, filed Dec. 4, 2019, and provisional patent application No. 62/981,902, filed Feb. 26, 2020, which are hereby incorporated by reference herein in their entireties.

BACKGROUND

This relates generally to imaging systems and, more particularly, to imaging systems that include single-photon avalanche diodes (SPADs) for single photon detection.

Modern electronic devices such as cellular telephones, cameras, and computers often use digital image sensors. Image sensors (sometimes referred to as imagers) may be formed from a two-dimensional array of image sensing pixels. Each pixel typically includes a photosensitive element (such as a photodiode) that receives incident photons (light) and converts the photons into electrical signals.

Conventional image sensors may suffer from limited functionality in a variety of ways. For example, some conventional image sensors may not be able to determine the distance from the image sensor to the objects that are being imaged. Conventional image sensors may also have lower than desired image quality and resolution.

To improve sensitivity to incident light, single-photon avalanche diodes (SPADs) may sometimes be used in imaging systems. Single-photon avalanche diodes may be capable of single-photon detection.

It is within this context that the embodiments described herein arise.

DETAILED DESCRIPTION

Embodiments of the present invention relate to imaging systems that include single-photon avalanche diodes (SPADs).

Some imaging systems include image sensors that sense light by converting impinging photons into electrons or holes that are integrated (collected) in pixel photodiodes within the sensor array. After completion of an integration cycle, collected charge is converted into a voltage, which is supplied to the output terminals of the sensor. In complementary metal-oxide semiconductor (CMOS) image sensors, the charge to voltage conversion is accomplished directly in the pixels themselves, and the analog pixel voltage is transferred to the output terminals through various pixel addressing and scanning schemes. The analog pixel voltage can also be later converted on-chip to a digital equivalent and processed in various ways in the digital domain.

In single-photon avalanche diode (SPAD) devices (such as the ones described in connection with FIGS. 1-4), on the other hand, the photon detection principle is different. The light sensing diode is biased above its breakdown point, and when an incident photon generates an electron or hole, this carrier initiates an avalanche breakdown with additional carriers being generated. The avalanche multiplication may produce a current signal that can be easily detected by readout circuitry associated with the SPAD. The avalanche process can be stopped (or quenched) by lowering the diode bias below its breakdown point. Each SPAD may therefore include a passive and/or active quenching circuit for halting the avalanche.

This concept can be used in two ways. First, the arriving photons may simply be counted (e.g., in low light level applications). Second, the SPAD pixels may be used to measure photon time-of-flight (ToF) from a synchronized light source to a scene object point and back to the sensor, which can be used to obtain a 3-dimensional image of the scene.

Figure 1:
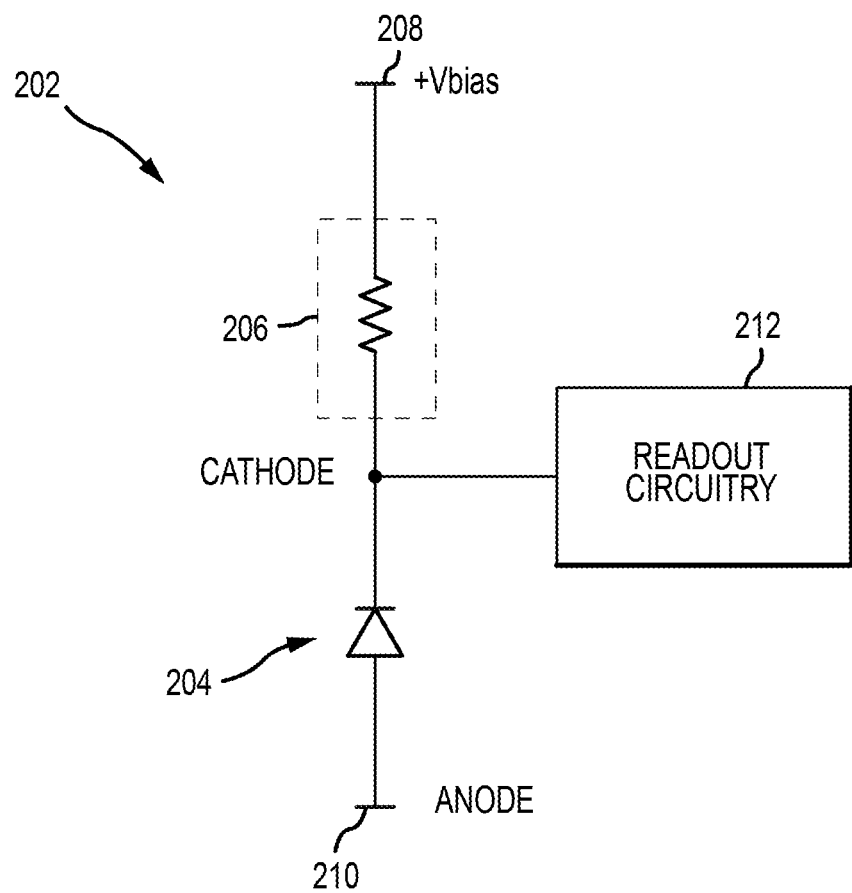
FIG. 1 is a circuit diagram showing an illustrative single-photon avalanche diode pixel in accordance with an embodiment.

FIG. 1 is a circuit diagram of an illustrative SPAD device 202. As shown in FIG. 1, SPAD device 202 includes a SPAD 204 that is coupled in series with quenching circuitry 206 between a first supply voltage terminal 210 (e.g., a ground power supply voltage terminal) and a second supply voltage terminal 208 (e.g., a positive power supply voltage terminal). In particular, SPAD device 202 includes a SPAD 204 having an anode terminal connected to power supply voltage terminal 210 and a cathode terminal connected directly to quenching circuitry 206. SPAD device 202 that includes SPAD 204 connected in series with a quenching resistor 206 is sometimes referred to collectively as a photo-triggered unit or "microcell." During operation of SPAD device 202, supply voltage terminals 208 and 210 may be used to bias SPAD 204 to a voltage that is higher than the breakdown voltage (e.g., bias voltage Vbias is applied to terminal 208).

Breakdown voltage is the largest reverse voltage that can be applied to SPAD 204 without causing an exponential increase in the leakage current in the diode. When SPAD 204 is reverse biased above the breakdown voltage in this manner, absorption of a single-photon can trigger a short-duration but relatively large avalanche current through impact ionization.

Quenching circuitry 206 (sometimes referred to as quenching element 206) may be used to lower the bias voltage of SPAD 204 below the level of the breakdown voltage. Lowering the bias voltage of SPAD 204 below the breakdown voltage stops the avalanche process and corresponding avalanche current. There are numerous ways to form quenching circuitry 206. Quenching circuitry 206 may be passive quenching circuitry or active quenching circuitry. Passive quenching circuitry may, without external control or monitoring, automatically quench the avalanche current once initiated. For example, FIG. 1 shows an example where a resistor component is used to form quenching circuitry 206. This is an example of passive quenching circuitry.

This example of passive quenching circuitry is merely illustrative. Active quenching circuitry may also be used in SPAD device 202. Active quenching circuitry may reduce the time it takes for SPAD device 202 to be reset. This may allow SPAD device 202 to detect incident light at a faster rate than when passive quenching circuitry is used, improving the dynamic range of the SPAD device. Active quenching circuitry may modulate the SPAD quench resistance. For example, before a photon is detected, quench resistance is set high and then once a photon is detected and the avalanche is quenched, quench resistance is minimized to reduce recovery time.

SPAD device 202 may also include readout circuitry 212. There are numerous ways to form readout circuitry 212 to obtain information from SPAD device 202. Readout circuitry 212 may include a pulse counting circuit that counts arriving photons. Alternatively or in addition, readout circuitry 212 may include time-of-flight circuitry that is used to measure photon time-of-flight (ToF). The photon time-of-flight information may be used to perform depth sensing. In one example, photons may be counted by an analog counter to form the light intensity signal as a corresponding pixel voltage. The ToF signal may be obtained by also converting the time of photon flight to a voltage. The example of an analog pulse counting circuit being included in readout circuitry 212 is merely illustrative. If desired, readout circuitry 212 may include digital pulse counting circuits. Readout circuitry 212 may also include amplification circuitry if desired.

The example in FIG. 1 of readout circuitry 212 being coupled to a node between diode 204 and quenching circuitry 206 is merely illustrative. Readout circuitry 212 may be coupled to terminal 208 or any desired portion of the SPAD device. In some cases, quenching circuitry 206 may be considered integral with readout circuitry 212.

Because SPAD devices can detect a single incident photon, the SPAD devices are effective at imaging scenes with low light levels. Each SPAD may detect the number of photons that are received within a given period of time (e.g., using readout circuitry that includes a counting circuit). However, as discussed above, each time a photon is received and an avalanche current initiated, the SPAD device must be quenched and reset before being ready to detect another photon. As incident light levels increase, the reset time becomes limiting to the dynamic range of the SPAD device (e.g., once incident light levels exceed a given level, the SPAD device is triggered immediately upon being reset).

Figure 2:
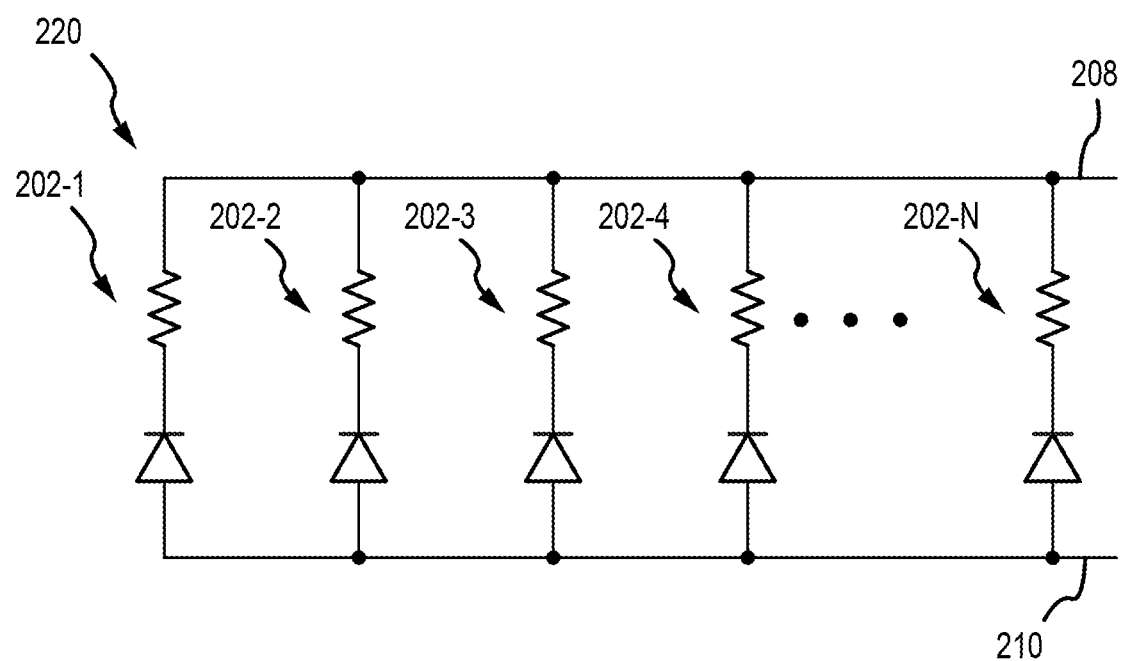
FIG. 2 is a diagram of an illustrative silicon photomultiplier in accordance with an embodiment.

Multiple SPAD devices may be grouped together to help increase dynamic range. FIG. 2 is a circuit diagram of an illustrative group 220 of SPAD devices 202. The group or array of SPAD devices may sometimes be referred to as a silicon photomultiplier (SiPM). As shown in FIG. 2, silicon photomultiplier 220 may include multiple SPAD devices that are coupled in parallel between first supply voltage terminal 208 and second supply voltage terminal 210. FIG. 2 shows N SPAD devices 202 coupled in parallel (e.g., SPAD device 202-1, SPAD device 202-2, SPAD device 202-3, SPAD device 202-4, . . . , SPAD device 202-N). More than two SPAD devices, more than ten SPAD devices, more than one hundred SPAD devices, more than one thousand SPAD devices, etc. may be included in a given silicon photomultiplier 220.

Each SPAD device 202 may sometimes be referred to herein as a SPAD pixel 202. Although not shown explicitly in FIG. 2, readout circuitry for the silicon photomultiplier 220 may measure the combined output current from all of SPAD pixels in the silicon photomultiplier. Configured in this way, the dynamic range of an imaging system including the SPAD pixels may be increased. Each SPAD pixel is not guaranteed to have an avalanche current triggered when an incident photon is received. The SPAD pixels may have an associated probability of an avalanche current being triggered when an incident photon is received. There is a first probability of an electron being created when a photon reaches the diode and then a second probability of the electron triggering an avalanche current. The total probability of a photon triggering an avalanche current may be referred to as the SPAD's photon-detection efficiency (PDE). Grouping multiple SPAD pixels together in the silicon photomultiplier therefore allows for a more accurate measurement of the incoming incident light. For example, if a single SPAD pixel has a PDE of 50% and receives one photon during a time period, there is a 50% chance the photon will not be detected. With the silicon photomultiplier 220 of FIG. 2, chances are that two of the four SPAD pixels will detect the photon, thus improving the provided image data for the time period.

The example of FIG. 2 in which the plurality of SPAD pixels 202 share a common output in silicon photomultiplier 220 is merely illustrative. In the case of an imaging system including a silicon photomultiplier having a common output for all of the SPAD pixels, the imaging system may not have any resolution in imaging a scene (e.g., the silicon photomultiplier can just detect photon flux at a single point). It may be desirable to use SPAD pixels to obtain image data across an array to allow a higher resolution reproduction of the imaged scene. In cases such as these, SPAD pixels in a single imaging system may have per-pixel readout capabilities. Alternatively, an array of silicon photomultipliers (each including more than one SPAD pixel) may be included in the imaging system. The outputs from each pixel or from each silicon photomultiplier may be used to generate image data for an imaged scene. The array may be capable of independent detection (whether using a single SPAD pixel or a plurality of SPAD pixels in a silicon photomultiplier) in a line array (e.g., an array having a single row and multiple columns or a single column and multiple rows) or an array having more than ten, more than one hundred, or more than one thousand rows and/or columns.

While there are a number of possible use cases for SPAD pixels as discussed above, the underlying technology used to detect incident light is the same. All of the aforementioned examples of devices that use SPAD pixels may collectively be referred to as SPAD-based semiconductor devices. A silicon photomultiplier with a plurality of SPAD pixels having a common output may be referred to as a SPAD-based semiconductor device. An array of SPAD pixels with per-pixel readout capabilities may be referred to as a SPAD-based semiconductor device. An array of silicon photomultipliers with per-silicon-photomultiplier readout capabilities may be referred to as a SPAD-based semiconductor device.

Figure 3:
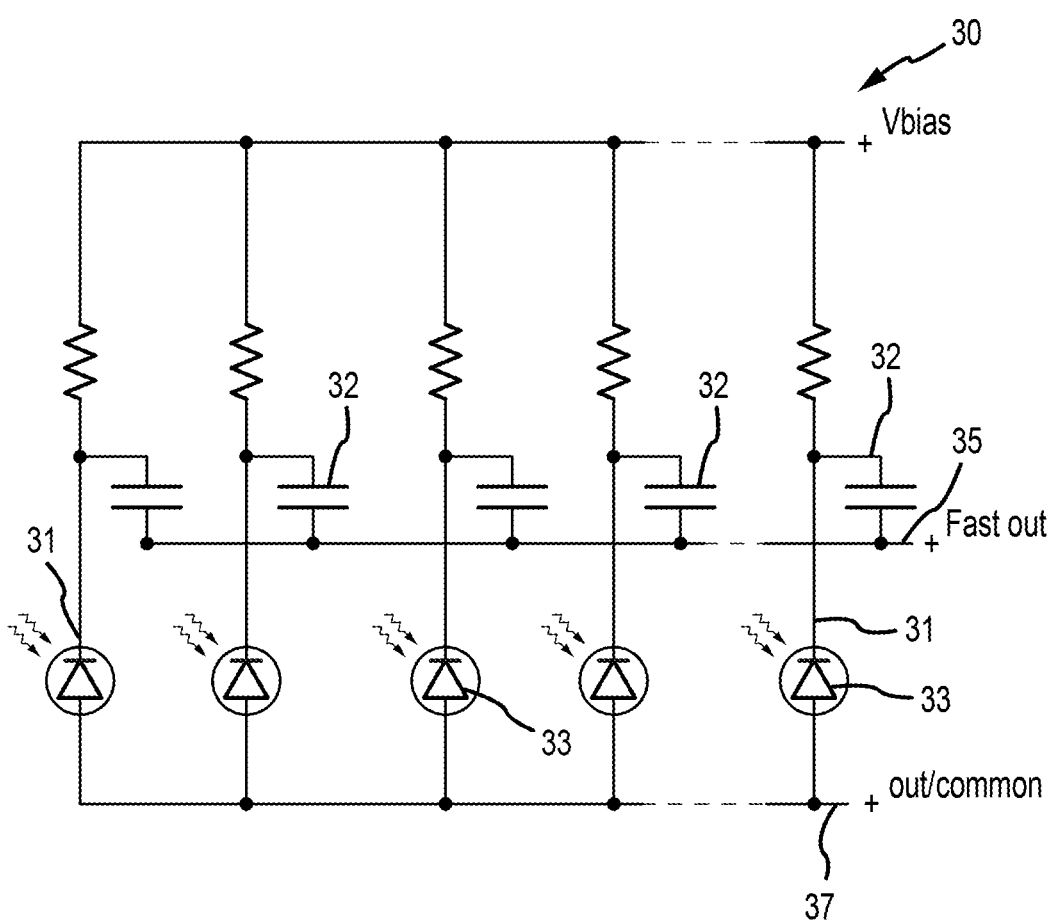
FIG. 3 is a schematic diagram of an illustrative silicon photomultiplier with a fast output terminal in accordance with an embodiment.

FIG. 3 illustrates a silicon photomultiplier 30. As shown in FIG. 3, SiPM 30 has a third terminal 35 which is capacitively coupled to each cathode terminal 31 in order to provide a fast readout of the avalanche signals from the SPADs 33. When then SPADs 33 emits a current pulse, part of the resulting change in voltage at the cathode 31 will be coupled via the mutual capacitance into the third ("fast") output terminal 35. Using the third terminal 35 for readout avoids the compromised transient performance resulting from the relatively large RC time constant associated with the biasing circuit that biases the top terminal of the quenching resistor.

Figure 4:
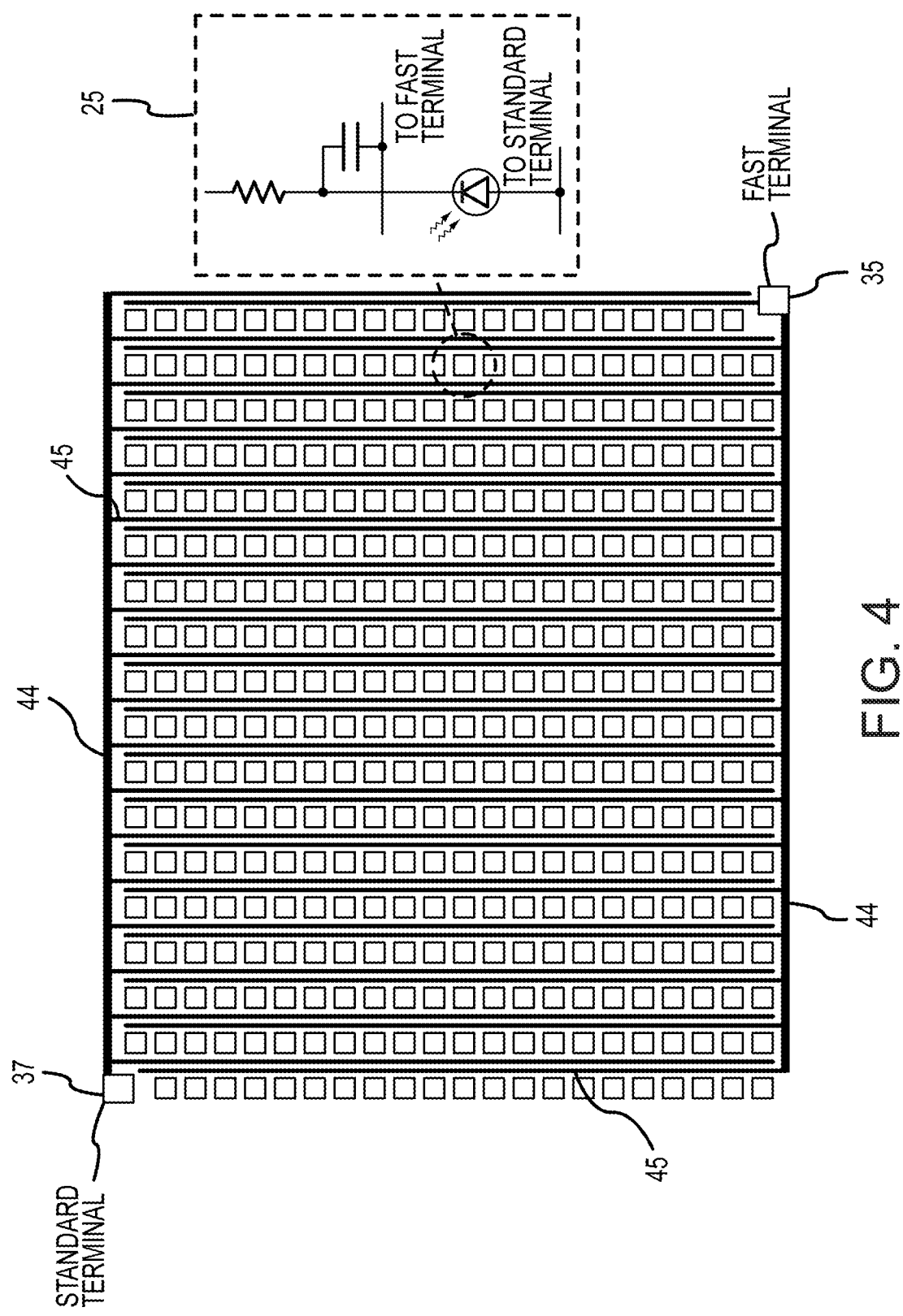
FIG. 4 is a diagram of an illustrative silicon photomultiplier comprising an array of microcells.

It will be appreciated by those skilled in the art that silicon photomultipliers include major bus lines 44 and minor bus lines 45 as illustrated in FIG. 4. The minor bus lines 45 may connect directly to each individual microcell 25. The minor bus lines 45 are then coupled to the major bus lines 44 which connect to the bond pads associated with terminals 37 and 35. Typically, the minor bus lines 45 extend vertically between the columns of microcells 25, whereas the major bus lines 44 extend horizontally adjacent the outer row of the microcells 25.

Figure 5:
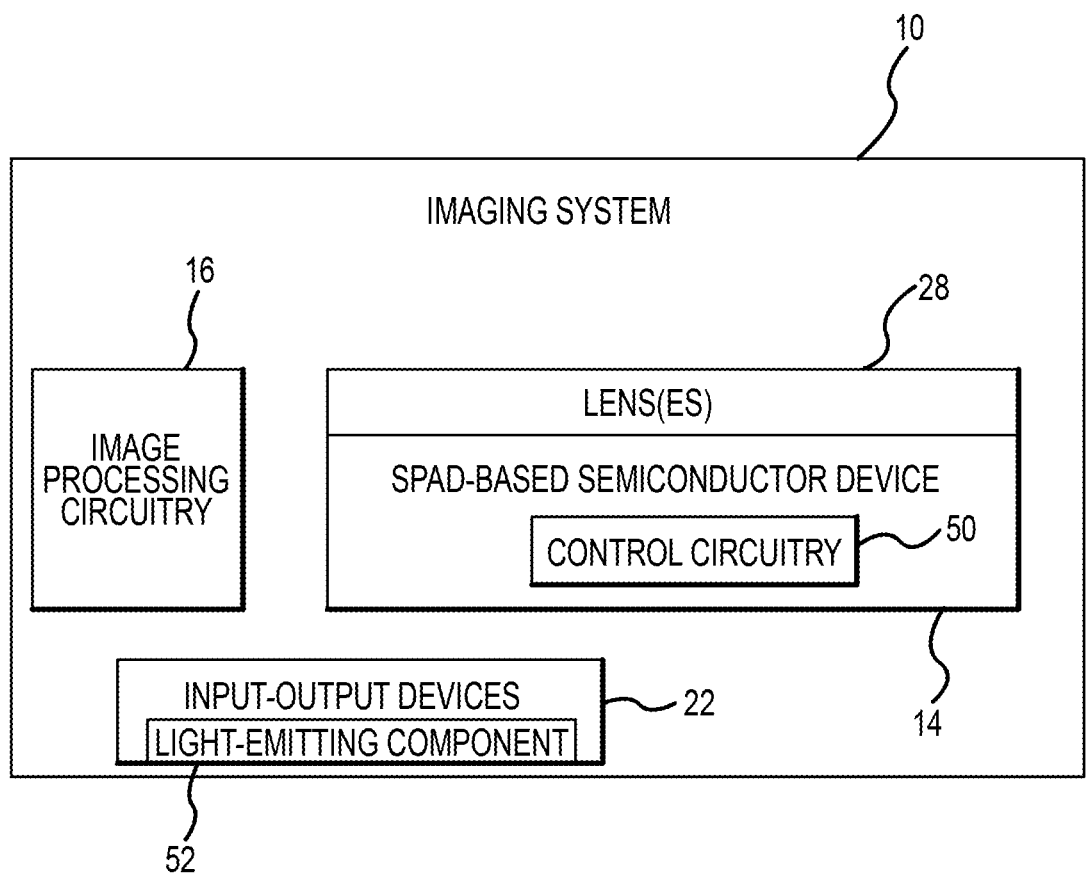
FIG. 5 is a schematic diagram of an illustrative imaging system that includes a SPAD-based semiconductor device in accordance with an embodiment.

An imaging system 10 with a SPAD-based semiconductor device is shown in FIG. 5. Imaging system 10 may be an electronic device such as a digital camera, a computer, a cellular telephone, a medical device, or other electronic device. Imaging system 10 may be an imaging system on a vehicle (sometimes referred to as vehicular imaging system). Imaging system 10 may be used for LIDAR applications. Imaging system 10 may sometimes be referred to as a SPAD-based imaging system.

Imaging system 10 may include one or more SPAD-based semiconductor devices 14 (sometimes referred to as semiconductor devices 14, devices 14, SPAD-based image sensors 14, or image sensors 14). One or more lenses 28 may optionally cover each semiconductor device 14. During operation, lenses 28 (sometimes referred to as optics 28) may focus light onto SPAD-based semiconductor device 14. SPAD-based semiconductor device 14 may include SPAD pixels that convert the light into digital data. The SPAD-based semiconductor device may have any number of SPAD pixels (e.g., hundreds, thousands, millions, or more). In some SPAD-based semiconductor devices, each SPAD pixel may be covered by a respective color filter element and/or microlens.

SPAD-based semiconductor device 14 may include circuitry such as control circuitry 50. The control circuitry for the SPAD-based semiconductor device may be formed either on-chip (e.g., on the same semiconductor substrate as the SPAD devices) or off-chip (e.g., on a different semiconductor substrate as the SPAD devices). The control circuitry may control operation of the SPAD-based semiconductor device. For example, the control circuitry may operate active quenching circuitry within the SPAD-based semiconductor device, may control a bias voltage provided to bias voltage supply terminal 208 of each SPAD, may control/monitor the readout circuitry coupled to the SPAD devices, etc.

The SPAD-based semiconductor device 14 may optionally include additional circuitry such as logic gates, digital counters, time-to-digital converters, bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc. Any of the aforementioned circuits may be considered part of the control circuitry 50 of FIG. 5.

Image data from SPAD-based semiconductor device 14 may be provided to image processing circuitry 16. Image processing circuitry 16 may be used to perform image processing functions such as automatic focusing functions, depth sensing, data formatting, adjusting white balance and exposure, implementing video image stabilization, face detection, etc. For example, during automatic focusing operations, image processing circuitry 16 may process data gathered by the SPAD pixels to determine the magnitude and direction of lens movement (e.g., movement of lens 28) needed to bring an object of interest into focus. Image processing circuitry 16 may process data gathered by the SPAD pixels to determine a depth map of the scene. In some cases, some or all of control circuitry 50 may be formed integrally with image processing circuitry 16.

Imaging system 10 may provide a user with numerous high-level functions. In a computer or advanced cellular telephone, for example, a user may be provided with the ability to run user applications. To implement these functions, the imaging system may include input-output devices 22 such as keypads, buttons, input-output ports, joysticks, and displays. Additional storage and processing circuitry such as volatile and nonvolatile memory (e.g., random-access memory, flash memory, hard drives, solid state drives, etc.), microprocessors, microcontrollers, digital signal processors, application specific integrated circuits, and/or other processing circuits may also be included in the imaging system.

Input-output devices 22 may include output devices that work in combination with the SPAD-based semiconductor device. For example, a light-emitting component 52 may be included in the imaging system to emit light (e.g., infrared light or light of any other desired type). Light-emitting component 52 may be a laser, light-emitting diode, or any other desired type of light-emitting component. Semiconductor device 14 may measure the reflection of the light off of an object to measure distance to the object in a LIDAR (light detection and ranging) scheme. Control circuitry 50 that is used to control operation of the SPAD-based semiconductor device may also optionally be used to control operation of light-emitting component 52. Image processing circuitry 16 may use known times (or a known pattern) of light pulses from the light-emitting component while processing data from the SPAD-based semiconductor device.

The likelihood of a photon being absorbed (e.g., the absorption percentage) increases with increasing semiconductor depth. To improve the sensitivity of a SPAD-based semiconductor device, it would therefore be desirable to increase the thickness of the semiconductor substrate. However, manufacturing considerations and other design factors may prevent or discourage semiconductor substrates from being thick enough for a target absorption percentage. To increase the absorption percentage without increasing semiconductor substrate thickness, light scattering structures may be included in the SPAD-based semiconductor device. The scattering structures may scatter incident light (e.g., using a low-index material that fills trenches in the semiconductor substrate), thereby increasing the path length of the light through the semiconductor substrate and increasing the probability of the incident light being absorbed by the semiconductor. Scattering the incident light (using refraction and/or diffraction) to increase the path length may be particularly helpful for incident light of higher wavelengths. Scattering incident light may improve absorption efficiency but may also make the SPAD-based semiconductor device susceptible to crosstalk.

The SPAD-based semiconductor device may also be susceptible to crosstalk caused by secondary emissions. The secondary emissions may be photons emitted when an avalanche occurs in a given SPAD. The photons from secondary emissions may pass from the SPAD of origin to an adjacent SPAD, causing crosstalk. Isolation structures may be included around each SPAD to prevent cross-talk. The SPAD-based semiconductor devices described herein may be used to sense near infrared light or light of any other desired type.

Figure 6:
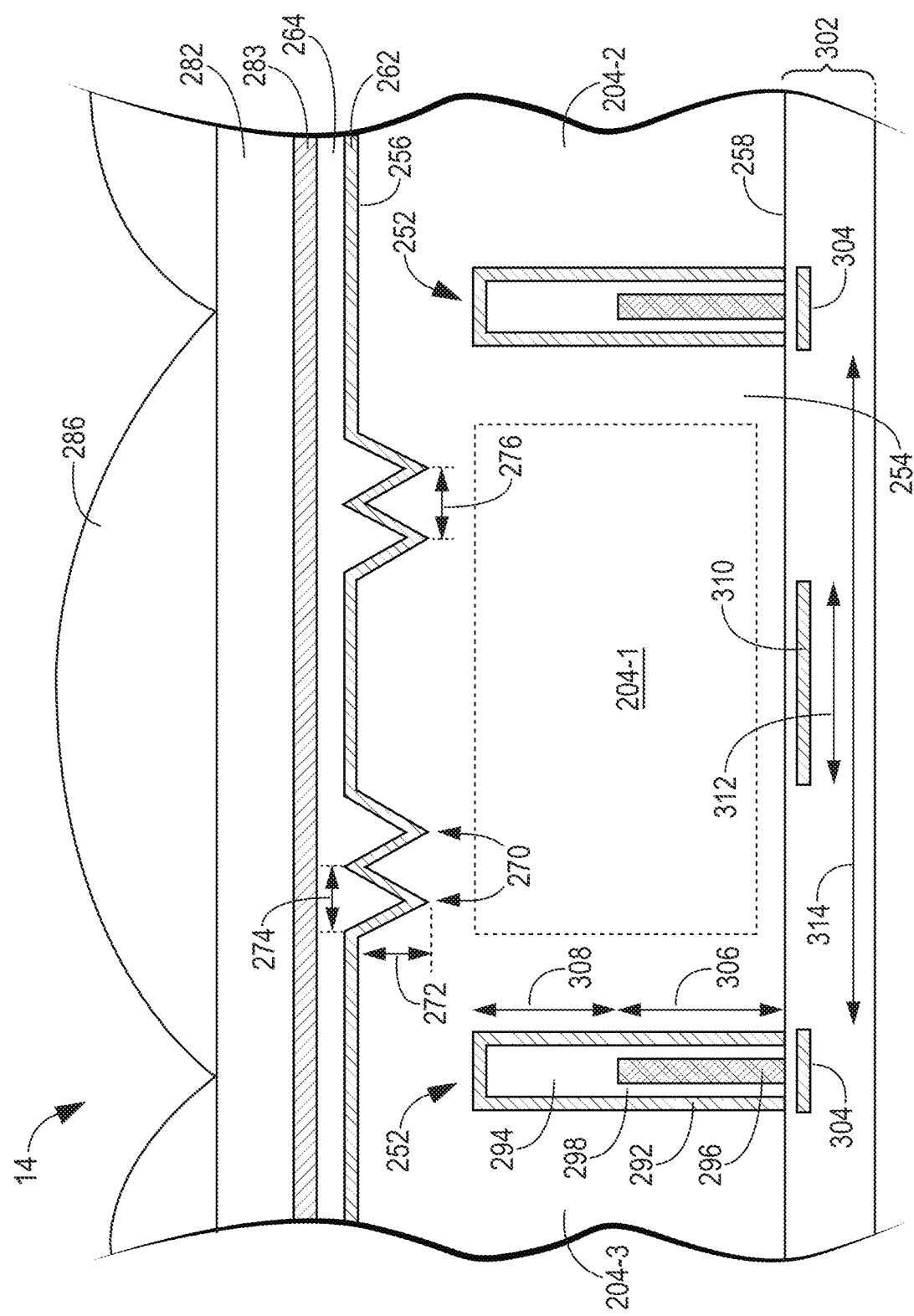
FIG. 6 is a cross-sectional side view of an illustrative backside illuminated (BSI) SPAD-based semiconductor device having an isolation structure that includes both a metal filler configured to absorb light and a low-index filler configured to reflect light in accordance with an embodiment.

FIG. 6 is a cross-sectional side view of an illustrative SPAD-based semiconductor device having scattering structures and hybrid isolation structures. SPAD-based semiconductor device 14 includes a SPAD 204-1 that is adjacent to respective SPADs (e.g., SPAD 204-2 and SPAD 204-3 in FIG. 6). Each SPAD may be considered part of a respective SPAD device, SPAD pixel, or microcell (e.g., microcell 202 in FIG. 1). The SPAD-based semiconductor device 14 in FIG. 6 is a backside illuminated (BSI) device (e.g., incident light passes through the back surface of the substrate).

Substrate 254 has a back surface 256 and a front surface 258. Front surface 258 may be adjacent to wiring layer 302. Wiring layer 302 may include metal signal lines 304 and/or transistors for operating the SPAD-based semiconductor device embedded in one or more dielectric layers. The side of substrate 254 adjacent to wiring layer 302 may be considered the front side of the semiconductor device. Therefore, surface 258 is the front surface and the SPAD-based semiconductor device is illuminated through the back surface 256.

SPAD 204-1 may be isolated from the adjacent SPADs by isolation structures. The isolation structures may include one or more deep trench isolation (DTI) structures. The isolation structures may include trenches with different fillers that serve different functions. The isolation structures may include a metal filler such as tungsten that absorbs light. The light absorbing material may prevent photons (e.g., generated by the SPAD during an avalanche) from passing to a neighboring microcell and causing crosstalk. The isolation structure may also have a portion that includes a low-index filler that causes total internal reflection. The low-index filler may reflect light, keeping the light within the active region of the SPAD to increase efficiency.

FIG. 6 shows a first isolation structure 252 that includes both a light absorbing portion and a reflective portion. Trenches for structure 252 may be formed in a substrate 254 (e.g., a semiconductor substrate formed from a material such as silicon). The trenches may extend from the front side of the substrate towards the back side of the substrate. In this case, the isolation structures may be referred to as front side deep trench isolation (FDTI).

A first portion (subset) of isolation structures 252 may be filled with a metal filler 296 (e.g., tungsten or any other desired metal). The metal filler absorbs incident light. A second portion (subset) of isolation structures 252 may be filled with low-index filler 294 (sometimes referred to as dielectric filler 294 or oxide filler 294). Low-index filler 294 may have a lower refractive index than substrate 254 (e.g., a refractive index that is lower by more than 0.1, more than 0.2, more than 0.3, more than 0.5, more than 1.0, more than 1.5, more than 2.0, etc.). The low-index material 294 causes total internal reflection of light, keeping the light within the active area of SPAD 204-1 and increasing the efficiency of SPAD 204-1. The low-index filler may be silicon dioxide or any other desired material.

A high dielectric constant coating 292 may be formed in the trench adjacent to the semiconductor substrate. The high dielectric constant coating 292 (sometimes referred to as high k coating 292 or passivation layer 292) may mitigate dark current. As one example, the passivation layer may be an oxide coating (e.g., aluminum oxide, hafnium oxide, tantalum oxide, etc.). The passivation layer may therefore be interposed between metal filler 296 and substrate 254 as well as between low-index filler 294 and substrate 254. A buffer layer 298 may be formed between passivation coating 292 and metal filler 296. The buffer layer 298 may be formed from silicon dioxide or another desired material (e.g., a material compatible with both the passivation coating and the metal filler). In one example, shown in FIG. 6, the same material may be used for both buffer layer 298 and low-index filler 294.

The isolation structures may form a ring around the microcell including SPAD 204-1. SPAD 204-1 may be completely laterally surrounded by isolation structures 252.

The metal filler 296 may have a depth (thickness) 306 and low-index filler 294 may have a depth (thickness) 308. Depths 306 and 308 may be selected to optimize performance of the SPAD-based semiconductor device. In general, increasing the thickness of metal filler 296 will decrease cross-talk between adjacent SPADs. However, because metal filler 296 absorbs light, including more metal filler 296 may reduce sensing efficiency. In contrast, low-index filler 294 reflects light at high angles to keep the light within the active region of SPAD 204-1. This light therefore has a chance to be absorbed within SPAD 204-1, which increases sensing efficiency. However, because the low-index filler does not absorb light, light that is not reflected may pass through to an adjacent SPAD and cause cross-talk. Depths 306 and 308 may therefore be selected to optimize crosstalk and efficiency for a particular SPAD-based semiconductor device.

As shown in FIG. 6, the portion of isolation structures 252 closer to the front side 258 may be formed by metal filler 296. The anode contact for SPAD 204-1 may be adjacent to the front surface 258. Therefore, the origin point of secondary emissions may primarily be adjacent to the front surface. The portions of isolation structures 252 that are adjacent to front surface 258 may receive photons (from secondary emissions) at orthogonal or near-orthogonal angles. The light absorbing metal filler is therefore used in this position to prevent crosstalk. The metal filler may have a depth 306 that is sufficient to block most secondary emissions. Above the metal filler, low-index filler 294 may receive light at higher (non-orthogonal angles) since the secondary emissions originate near front surface 258. Low-index filler 294 therefore reflects the light (using total internal reflection), preventing the light from passing to neighboring SPADs.

The semiconductor substrate may have a thickness of greater than 4 micron, greater than 6 micron, greater than 8 micron, greater than 10 micron, greater than 12 micron, less than 12 micron, between 4 and 10 micron, between 5 and 20 micron, less than 10 micron, less than 6 micron, less than 4 micron, less than 2 micron, greater than 1 micron, etc. Depth 306 may be greater than 4 micron, greater than 6 micron, greater than 8 micron, greater than 10 micron, greater than 12 micron, less than 12 micron, less than 4 and 10 micron, between 5 and 20 micron, between 2 and 10 micron, between 3 and 6 micron, less than 10 micron, less than 6 micron, less than 4 micron, less than 2 micron, greater than 1 micron, etc. Depth 308 may be greater than 4 micron, greater than 6 micron, greater than 8 micron, greater than 10 micron, greater than 12 micron, less than 12 micron, between 4 and 10 micron, between 5 and 20 micron, between 2 and 10 micron, between 3 and 6 micron, less than 10 micron, less than 6 micron, less than 4 micron, less than 2 micron, greater than 1 micron, etc. The total thickness of the trench for deep trench isolation structure 252 may be greater than 4 micron, greater than 6 micron, greater than 8 micron, greater than 10 micron, greater than 12 micron, less than 12 micron, between 4 and 10 micron, between 5 and 20 micron, between 2 and 10 micron, between 3 and 6 micron, less than 10 micron, less than 6 micron, less than 4 micron, less than 2 micron, greater than 1 micron, etc.

Depth 306 may make up a percentage of the total depth of the isolation structures 252. This percentage may be greater than 20%, greater than 40%, greater than 50%, greater than 70%, greater than 90%, less than 90%, less than 80%, less than 60%, less than 40%, between 10% and 70%, between 30% and 60%, etc. The depth 308 of low-index filler 294 may make up the remaining percentage of total depth of the isolation structures 252. In some cases, low-index filler 294 may be omitted and metal filler 296 may be the only filler in DTI 252. In other words, metal filler 296 may have a depth that is 100% or approximately (e.g., within 5% of) 100% of the total trench depth.

Depth 306 may make up a percentage of the total thickness of the substrate 254. This percentage may be greater than 20%, greater than 40%, greater than 50%, greater than 70%, greater than 90%, less than 80%, less than 60%, less than 40%, between 10% and 70%, between 30% and 60%, etc.

The depth of isolation structures 252 may be less than 90% of the substrate thickness, less than 80% of the substrate thickness, less than 60% of the substrate thickness, less than 50% of the substrate thickness, less than 40% of the substrate thickness, more than 50% of the substrate thickness, between 20% and 90% of the substrate thickness, etc. Alternatively, isolation structure 252 may extend entirely through the substrate.

In addition to the isolation structures, scattering structures 270 may be formed in the substrate. Scattering structures 270 may be configured to scatter incident light (e.g., using a low-index material that fills trenches in substrate 254), thereby increasing the path length of the light through the semiconductor substrate and increasing the probability of the incident light being absorbed by the semiconductor. Scattering the incident light (using refraction and/or diffraction) to increase the path length may be particularly helpful for incident light of higher wavelengths (e.g., near infrared light).

The scattering structures may be formed using trenches in the substrate (e.g., trenches that extend from surface 256 towards surface 258 in FIG. 6). In FIG. 6, SPAD-based semiconductor device 14 is a BSI device and therefore the light scattering structures are formed in backside trenches. However, in some cases, SPAD-based semiconductor device 14 is a FSI device and the light scattering structures may be formed in front side trenches.

The trenches may be filled by a passivation coating 262 and low-index filler 264. Low-index filler 264 (sometimes referred to as dielectric filler 264 or oxide filler 264) may have a lower refractive index than substrate 254 (e.g., a refractive index that is lower by more than 0.1, more than 0.2, more than 0.3, more than 0.5, more than 1.0, more than 1.5, more than 2.0, etc.). The low-index material in the trenches causes diffractive and/or refractive scattering of incident light. Low-index filler 264 may be silicon dioxide or any other desired material. In some cases, the same material that forms low-index filler 294 and/or buffer layer 298 may be used as the low-index filler 264.

Passivation layer 262 may be a high dielectric constant coating that is formed between the substrate 254 and low-index filler 264. The passivation layer 262 (sometimes referred to as high k coating 262) may mitigate dark current. As one example, the passivation coating may be an oxide coating (e.g., aluminum oxide, hafnium oxide, tantalum oxide, etc.). Passivation layer 262 may be formed from the same material as passivation layer 292 or from a different material as passivation layer 262.

As shown, passivation coating 262 has a uniform thickness both inside and outside of the trenches for light scattering structures 270. This example is merely illustrative. As shown in FIG. 6, the low-index filler 264 may fill trenches for scattering structures 270 and extend above the plane of surface 256.

Scattering structures 270 scatter incident light, thereby increasing the path length of the light through the semiconductor substrate and increasing the probability of the incident light being absorbed by the semiconductor. Isolation structures 252 prevent the scattered light from reaching an adjacent SPAD and causing cross-talk.

One or more microlenses 286 may be formed over SPAD 204-1. In the arrangement of FIG. 6, a single microlens 286 is formed over SPAD 204-1. The microlens may focus light towards light scattering structures 270 and SPAD 204-1. Microlens 286 may have an upper surface with spherical curvature. This example is merely illustrative, and other microlens arrangements of one or more microlenses may be used if desired. Other possible microlens arrangements over a SPAD may include a single toroidal microlens, two cylindrical microlenses, a toroidal microlens with a central opening and an additional microlens in the central opening, etc.

A color filter layer 282 may optionally be interposed between low-index filler 264 and microlens(es) 286. The color filter layer 282 may be a band pass filter that transmits light at a wavelength of interest (e.g., near infrared light) while blocking (e.g., absorbing and/or reflecting) light at other wavelengths. An additional oxide layer 283 (e.g., silicon dioxide or another desired material) may optionally be formed on the back side of substrate 254 between low-index layer 264 and color filter layer 282.

The light scattering structures each have a height 272 (sometimes referred to as depth) and a width 274. The light scattering structures also have a pitch 276 (e.g., the center-to-center separation between each light scattering structure). In general, each scattering structure may have a height 272 of less than 5 micron, less than 3 micron, less than 2 micron, less than 1 micron, less than 0.5 micron, less than 0.1 micron, greater than 0.01 micron, greater than 0.5 micron, greater than 1 micron, between 1 and 2 micron, between 0.5 and 3 micron, between 0.3 micron and 10 micron, etc. Each scattering structure may have a width 274 of less than 5 micron, less than 3 micron, less than 2 micron, less than 1 micron, less than 0.5 micron, less than 0.1 micron, greater than 0.01 micron, greater than 0.5 micron, greater than 1 micron, between 1 and 2 micron, between 0.5 and 3 micron, between 0.3 micron and 10 micron, etc. The pitch 276 may be less than 5 micron, less than 3 micron, less than 2 micron, less than 1 micron, less than 0.5 micron, less than 0.1 micron, greater than 0.01 micron, greater than 0.5 micron, greater than 1 micron, between 1 and 2 micron, between 0.5 and 3 micron, between 0.3 micron and 10 micron, etc. The ratio of the width 274 to the pitch 276 may be referred to as the duty cycle or the etch percentage for the substrate. The duty cycle (etch percentage) indicates how much unetched substrate is present between each pair of scattering structures and how much of the upper surface of the substrate is etched to form the light scattering structures. The ratio may be 100% (e.g., each scattering structure is immediately adjacent to surrounding scattering structures), lower than 100%, lower than 90%, lower than 70%, lower than 60%, greater than 50%, greater than 70%, between (and including) 50% and 100%, etc.

In the example of FIG. 6, the scattering structures 270 have angled sidewalls (e.g., sidewalls that are non-orthogonal and non-parallel to back surface 256). The scattering structures may be pyramidal or may have a triangular cross-section that extends along a longitudinal axis (e.g., a triangular prism). The non-orthogonal angle may be greater than 10 degrees, greater than 30 degrees, greater than 60 degrees, less than 80 degrees, between 20 and 70 degrees, etc. The example of angled sidewalls in FIG. 6 is merely illustrative. The scattering structures may have vertical sidewalls (orthogonal to surface 256) if desired.

The arrangement and dimensions of scattering structures 270 may be selected to optimize the conversion of incident light. As shown in FIG. 6, the active area of SPAD 204-1 may not include the entirety of the substrate 254. The arrangement and dimensions of scattering structures 270 may be selected to direct incident light to SPAD 204-1 and not surrounding dead zones in the semiconductor substrate.

Microlens 286 may have a thickness of greater than 0.5 micron, greater than 1 micron, greater than 2 microns, greater than 3 microns, greater than 5 microns, greater than 8 microns, between (and including) 1 and 10 microns, less than 10 microns, less than 5 microns, between (and including) 5 and 10 microns, between (and including) 3 and 5 microns, etc.

The light scattering structures may have a uniform density (number of light scattering structures per unit area). Alternatively, the light scattering structures may have a non-uniform density. Arranging light scattering structures with a non-uniform density in this way may help direct light to SPAD 204-1 in an optimal manner. In general, etching substrate 254 (e.g., to form light scattering structures) may cause an increase in dark current in the SPAD-based semiconductor device. Accordingly, light scattering structures may be omitted where possible to minimize dark current while still optimizing absorption. Omitting light scattering structures may include reducing the density of the light scattering structures to a non-zero magnitude or entirely omitting the light scattering structures in a certain area of the microcell (e.g., to a density of zero).

In general, each microcell (and corresponding SPAD) may be covered by any desired microlens(es). However, there may be a correlation between the microlens design and the arrangement of the light scattering structures for the microcell. The microlens(es) may focus more light on a first area of the substrate than a second area of the substrate. The light scattering structures may therefore have a greater density (e.g., a higher percentage of the substrate is etched for the scattering structures) in the first area of the substrate than the second area of the substrate (to more effectively scatter the light). The second area of the substrate (with a lower density of scattering structures) may have no scattering structures (e.g., the scattering structures are entirely omitted) or may have a lower, non-zero density of scattering structures. The transition between different densities may be gradual or immediate.

FIG. 6 shows an example where the light scattering structures have a lower density (e.g., are omitted) in a center of the microcell than in a ring-shaped periphery of the microcell. Other arrangements of microcells may be used if desired.

A front side reflector 310 may optionally be formed at the front side of the SPAD 204-1 (e.g., in wiring layer 302). As shown, front side reflector 310 is adjacent to the front surface 258 of semiconductor substrate 254. Front side reflector 310 may have a width 312. The microcell may have a width 314 that extends between the isolation structures 252. Width 312 may optionally be smaller than width 314. Width 312 may be less than 90% of width 314, less than 80% of width 314, less than 60% of width 314, less than 50% of width 314, less than 40% of width 314, between 20% and 90% of width 314, greater than 30% of width 314, etc.

FIG. 6 shows an example of a hybrid deep trench isolation structure (that includes a first filler in a first subset and a second filler in a second, different subset). The hybrid deep trench isolation structure includes a trench. A first part of the trench is filled with a metal (light absorbing) filler. A second part of the trench is filled with a low-index filler to cause reflection of light. In FIG. 6, a single front side trench is used for the hybrid DTI structure. This example is merely illustrative.

Figure 7:
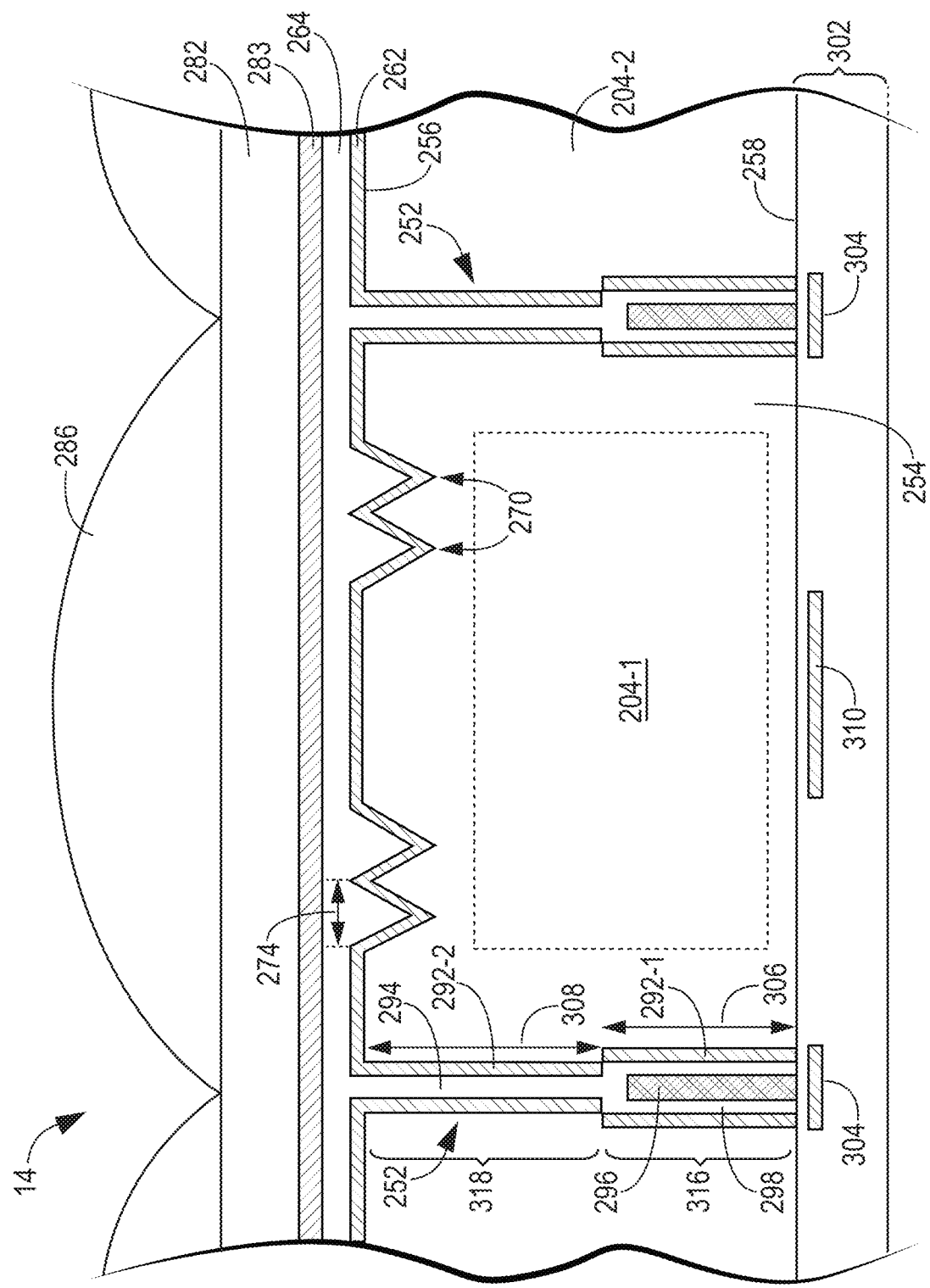
FIG. 7 is a cross-sectional side view of an illustrative backside illuminated (BSI) SPAD-based semiconductor device having an isolation structure that includes both a front side deep trench isolation (FDTI) portion with a metal filler and a backside deep trench isolation (BDTI) portion with a low-index filler in accordance with an embodiment.

FIG. 7 is a cross-sectional side view of another possible arrangement where a hybrid deep trench isolation structure is formed from a backside trench that meets a front side trench. As shown, isolation structure 252 includes a FDTI portion 316 formed by a trench that extends from front surface 258 towards back surface 256 (with depth 306). This portion of the isolation structure has metal filler 296 in the trench as well as a buffer layer 298 and a passivation layer 292-1 (e.g., the same arrangement as discussed in connection with FIG. 6).

Isolation structure 252 also includes a BDTI portion 318 formed by a trench that extends from back surface 256 towards front surface 258 (with depth 308). BDTI portion 318 includes a low-index filler 294 (as in FIG. 6). This portion of the isolation structure also includes a passivation layer 292-2 (that may be formed from the same material as passivation layer 292-1 and/or passivation layer 262). Because BDTI 318 and FDTI 316 are formed using separate etching steps, the two isolation structure portions may have different trench widths (as depicted in FIG. 7).

Figure 8:
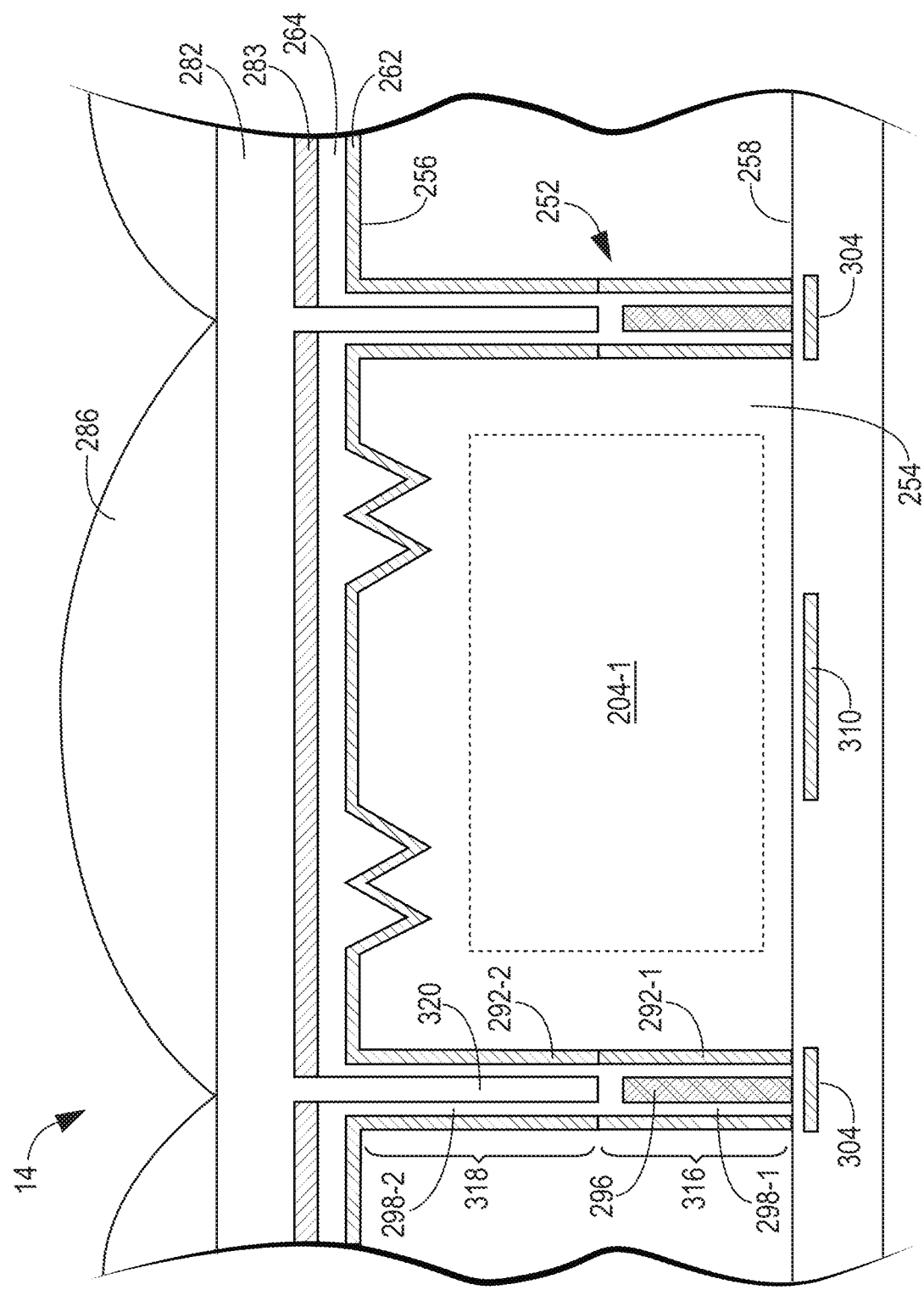
FIG. 8 is a cross-sectional side view of an illustrative backside illuminated (BSI) SPAD-based semiconductor device having an isolation structure that includes a front side deep trench isolation (FDTI) portion with a metal filler and a backside deep trench isolation (BDTI) portion filled with a color filtering material in accordance with an embodiment.

In another possible arrangement, shown in FIG. 8, color filtering material may be used as a filler in the BDTI portion of the hybrid isolation structures. As shown in FIG. 8, BDTI portion 318 may include a passivation layer 292-2, buffer layer 298-2, and filler material 320. Passivation layer 292-2 may be formed from the same material as passivation layer 262 and/or passivation layer 292-1. Buffer layer 298-2 may be formed from the same material as low-index layer 264 and/or buffer layer 298-1.

Filler material 320 may be a color filter material that absorbs light at some or all wavelengths. In one example, filler material 320 may be the same material as the color filtering material of color filter element 282. In this case, the color filter material 320 in BDTI 318 serves as a band pass filter (similar to the color filter element 282) that transmits near infrared light (or light of another desired type). In another possible embodiment, filler material may be formed from a black color filtering material that absorbs light at all wavelengths (e.g., all visible and infrared wavelengths). The filler material may be an organic material or other desired material (e.g., a non-metal material).

In some cases, FDTI portion 316 may be omitted and BDTI portion 318 with color filtering filler 320 may be the only component of the isolation structures.

FIGS. 6-8 show examples of backside illuminated (BSI) SPAD-based semiconductor devices. However, the concepts of a hybrid DTI structure and using color filtering material as a DTI filler material may also be applied to front side illuminated (FSI) SPAD-based semiconductor devices.

Figure 9:
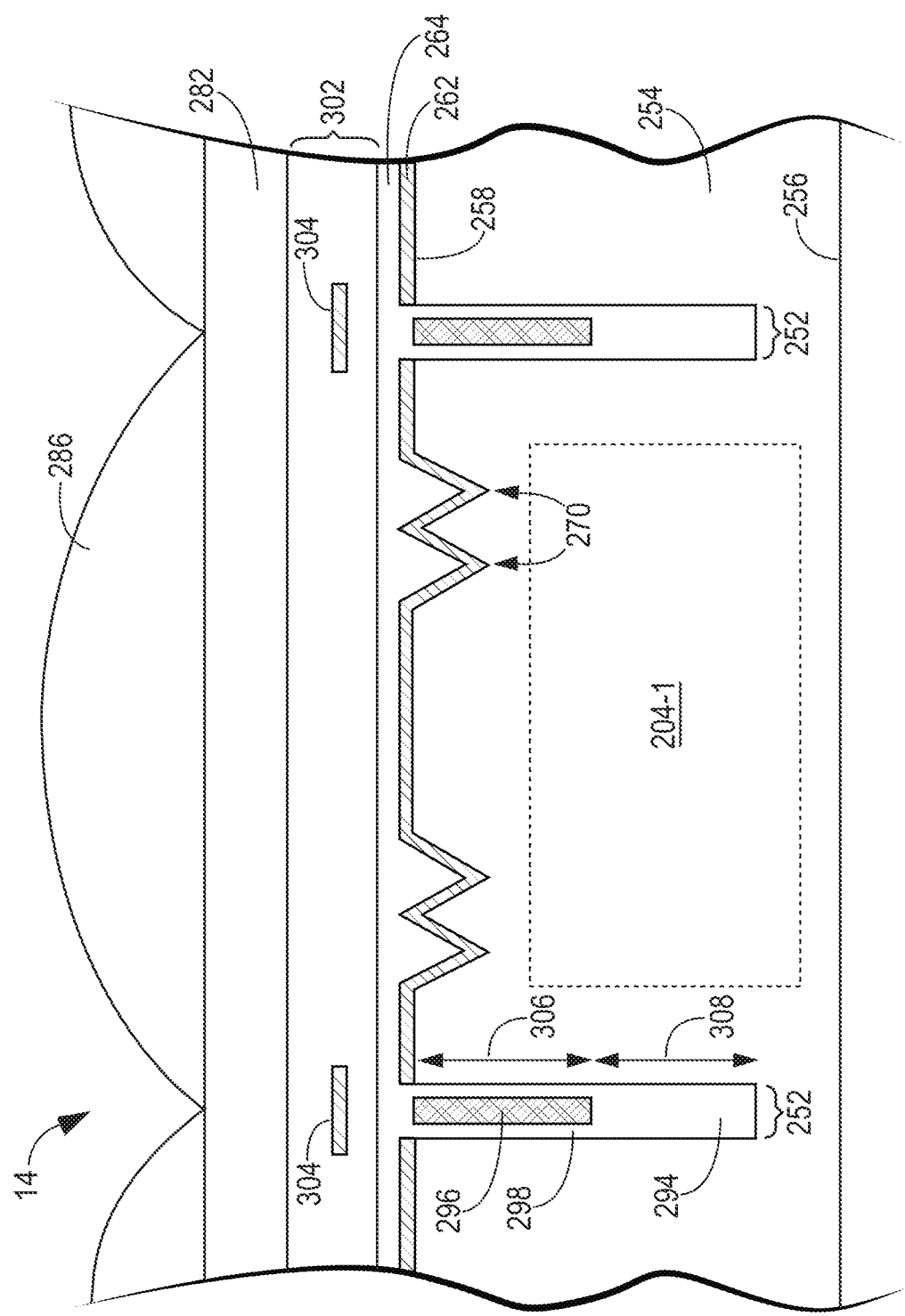
FIG. 9 is a cross-sectional side view of an illustrative front side illuminated (FSI) SPAD-based semiconductor device having an isolation structure that includes both a metal filler configured to absorb light and a low-index filler configured to reflect light in accordance with an embodiment.

FIG. 9 is a cross-sectional side view of an illustrative FSI SPAD-based semiconductor device having hybrid isolation structures. As shown in FIG. 9, wiring layer 302 is interposed between substrate 254 and microlens 286. Color filter element 282 is interposed between wiring layer 302 and microlens 286.

Isolation structures 252 in FIG. 9 are similar to those depicted in FIG. 6. As shown, the isolation structures include a trench that extends from front surface 258 towards back surface 256. The trench includes both a metal filler 296 (e.g., tungsten) and a low-index filler 294. A buffer layer 298 is interposed between metal filler 296 and substrate 254. Buffer layer 298 may optionally be formed from the same material as low-index filler 294 and/or low-index filler 264 (for light scattering structures 270).

In FIG. 9, the portion of DTI structure 252 closer to microlens 286 has the metal filler (instead of the oxide filler as in FIG. 6). Wiring layer 302 is now interposed between substrate 254 and microlens 286. The anode contact for SPAD 204-1 may still be adjacent to front surface 258. Therefore, it is still desirable to form the light absorbing metal filler 296 closer to the front surface and the low-index (reflective) filler further from the front surface. The respective depths 306 and 308 may be the same as discussed in connection with FIG. 6.

Figure 10:
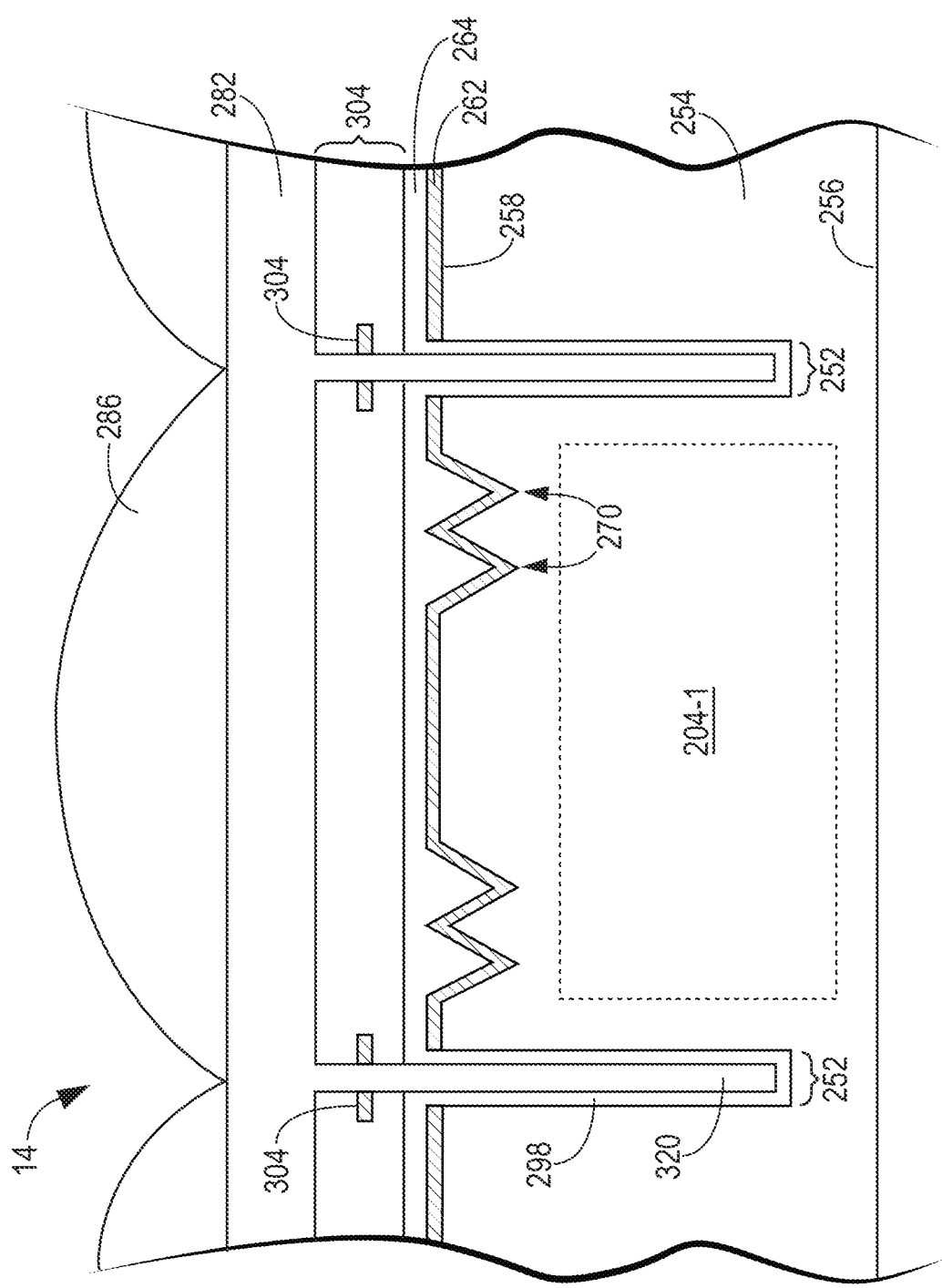
FIG. 10 is a cross-sectional side view of an illustrative front side illuminated (FSI) SPAD-based semiconductor device having an isolation structure that includes a color filtering material in accordance with an embodiment.

FIG. 10 shows an FSI SPAD-based semiconductor device where color filtering material is used as a filler for the isolation structures (similar to as in FIG. 8). As shown, color filtering material 320 fills a trench for DTI structures 252. Buffer layer 298 may be interposed between the color filtering material 320 and the semiconductor substrate.

Similar to as discussed in connection with FIG. 8, filler material 320 may be the same material as color filter element 282. In this case, the color filter material in FDTI 252 serves as a band pass filter (similar to the color filter element 282). In another possible embodiment, filler material 320 may be formed from a black color filtering material that absorbs light at all wavelengths (e.g., all visible and infrared wavelengths). The filler material may be an organic material or other desired material (e.g., a non-metal material).

The examples in FIGS. 9 and 10 of having a single FDTI trench form isolation structures 252 is merely illustrative. If desired, both a FDTI and BDTI trench may be used to form isolation structures (similar to as shown in FIG. 7) in a FSI SPAD-based semiconductor device.

It should be noted that, if desired, the color filter element 282 may be omitted from any of the embodiments of FIGS. 6-10. Additionally, any of FIGS. 6-10 may have any desired microlens and light scattering structure arrangement.

Additionally, the DTI structures are sometimes depicted as including a passivation layer (e.g., passivation layer 292 in FIG. 6). It should be understood that any DTI structure may optionally include or not include the passivation layer. For example, FDTI structures (such as those of FIGS. 9 and 10) may omit the passivation layer and may use other techniques to mitigate dark current caused by etching (e.g., a p-type doped liner around the trench).

The foregoing is merely illustrative of the principles of this invention and various modifications can be made by those skilled in the art. The foregoing embodiments may be implemented individually or in any combination.

What is claimed is:

1. A semiconductor device comprising:
    a substrate having first and second opposing surfaces;
    a single-photon avalanche diode formed in the substrate, wherein the single-photon avalanche diode is illuminated through the first surface; and
    a deep trench isolation structure in the substrate that extends around the single-photon avalanche diode, wherein the deep trench isolation structure comprises a metal filler in a first subset of the deep trench isolation structure and a low-index filler in a second, different subset of the deep trench isolation structure, wherein the low-index filler is interposed between the metal filler and the first surface, and wherein the low-index filler has a greater depth thickness between the metal filler and the first surface than a distance between the metal filler and the second surface.

2. The semiconductor device defined in claim 1, wherein the low-index filler has a lower index of refraction than the substrate.

3. The semiconductor device defined in claim 1, wherein the second surface is a front surface and the first surface is a back surface, wherein the metal filler and the low-index filler are formed in a front side trench that extends from the front surface towards the back surface, wherein the metal filler extends from the front surface to a first depth in the front side trench, and wherein the low-index filler extends from the first depth in the front side trench to a second depth in the front side trench.

4. The semiconductor device defined in claim 3, further comprising:
    a wiring layer adjacent to the front surface of the substrate; and
    a reflector in the wiring layer, wherein the reflector and the single-photon avalanche diode are overlapping.

5. The semiconductor device defined in claim 1, further comprising light scattering structures in the substrate.

6. The semiconductor device defined in claim 5, wherein the light scattering structures are included in a ring-shaped pattern over the single-photon avalanche diode.

7. The semiconductor device defined in claim 1, further comprising:
    a microlens; and
    a color filter element that is interposed between the microlens and the substrate, wherein the low-index filler is interposed between the metal filler and the color filter element.

8. The semiconductor device defined in claim 1, wherein the second surface is a front surface and the first surface is a back surface, wherein the metal filler is formed in a front side trench portion of the deep trench isolation structure, and wherein the low-index filler is formed in a backside trench portion of the deep trench isolation structure.

9. The semiconductor device defined in claim 1, wherein the deep trench isolation structure comprises a buffer layer that is interposed between the metal filler and the substrate.

10. The semiconductor device defined in claim 9, wherein the buffer layer and the low-index filler are formed from the same material.

11. The semiconductor device defined in claim 1, wherein the first surface is a back surface, wherein the second surface is a front surface, and wherein the single-photon avalanche diode is backside illuminated.

12. The semiconductor device defined in claim 1, wherein the metal filler has an additional depth thickness that is a percentage of a total depth thickness for the deep trench isolation structure and wherein the percentage is greater than 20%.

13. A semiconductor device comprising:
a substrate;
a single-photon avalanche diode formed in the substrate;
light scattering structures in the substrate, wherein the light scattering structures are included in a ring-shaped pattern over the single-photon avalanche diode; and
a deep trench isolation structure in the substrate that extends around the single-photon avalanche diode, wherein the deep trench isolation structure comprises a trench and a color filtering material in the trench.

14. The semiconductor device defined in claim 13, wherein the color filtering material is a band pass filter.

15. The semiconductor device defined in claim 13, wherein the color filtering material is a black color filtering material.

16. The semiconductor device defined in claim 13, wherein the substrate has a front surface and a back surface and wherein the semiconductor device is backside illuminated.

17. The semiconductor device defined in claim 13, wherein the substrate has a front surface and a back surface and wherein the semiconductor device is front side illuminated.

18. The semiconductor device defined in claim 13, further comprising:
a microlens; and
a color filter element that is interposed between the microlens and the substrate, wherein the color filter element comprises an additional color filtering material that is different than the color filtering material.

19. A semiconductor device comprising:
a substrate;
a single-photon avalanche diode formed in the substrate;
a microlens;
a color filter element that is interposed between the microlens and the substrate, wherein the color filter element is formed from a color filtering material;
a wiring layer that is interposed between the substrate and the microlens, wherein the wiring layer includes metal signal lines; and
a deep trench isolation structure in the substrate that extends around the single-photon avalanche diode, wherein the deep trench isolation structure comprises a trench that extends from the color filter element, through the wiring layer, and into the substrate and wherein a portion of the color filtering material is formed in the trench.

20. The semiconductor device defined in claim 19, wherein the color filtering material is a band pass filter that transmits near infrared light.

* * * * *